(12) United States Patent
Albrecht et al.

(10) Patent No.: US 9,180,569 B2
(45) Date of Patent: Nov. 10, 2015

(54) DOUBLE SIDE POLISHER WITH PLATEN PARALLELISM CONTROL

(71) Applicant: SunEdison Semiconductor Limited (UEN201334164H), St. Peters, MO (US)

(72) Inventors: Peter D. Albrecht, O'Fallon, MO (US); Sumeet S. Bhagavat, St. Charles, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 57 days.

(21) Appl. No.: 14/107,806

(22) Filed: Dec. 16, 2013

(65) Prior Publication Data

US 2014/0170781 A1    Jun. 19, 2014

Related U.S. Application Data

(60) Provisional application No. 61/738,733, filed on Dec. 18, 2012.

(51) Int. Cl.
| | |
|---|---|
| *B24B 37/04* | (2012.01) |
| *B24B 7/22* | (2006.01) |
| *H01L 21/306* | (2006.01) |
| *H01L 21/66* | (2006.01) |
| *B24B 37/08* | (2012.01) |
| *B24B 37/12* | (2012.01) |

(52) U.S. Cl.
CPC ................. *B24B 7/228* (2013.01); *B24B 37/08* (2013.01); *B24B 37/12* (2013.01); *H01L 21/30625* (2013.01); *H01L 22/12* (2013.01)

(58) Field of Classification Search
CPC ........ B24B 37/04; B24B 37/12; B24B 37/08; B24B 49/16; B24B 37/013; B24B 49/04; B24B 49/12; B24B 49/14; B24B 49/08

USPC .......... 451/6, 7, 8, 41, 53, 262, 268, 274, 398, 451/400

See application file for complete search history.

(56) References Cited

U.S. PATENT DOCUMENTS

| | | | | |
|---|---|---|---|---|
| 4,593,495 A | * | 6/1986 | Kawakami et al. | ........... 451/269 |
| 5,441,442 A | | 8/1995 | Haisma et al. | |
| 6,024,630 A | * | 2/2000 | Shendon et al. | ................ 451/41 |

(Continued)

FOREIGN PATENT DOCUMENTS

EP       1489649 A1     12/2004

OTHER PUBLICATIONS

International Search Report and Written Opinion of the International Searching Authority regarding PCT/US2013/075465 mailed on Apr. 3, 2014; 9 pgs.

*Primary Examiner* — George Nguyen
(74) *Attorney, Agent, or Firm* — Armstrong Teasdale LLP

(57) ABSTRACT

A platen for polishing a surface of a wafer has a reaction plate, a polishing plate, and a bladder. The reaction plate has a top and bottom surface, and defines a longitudinal axis. The polishing plate is positioned coaxially with the reaction plate. The polishing plate has a second top surface and a second bottom surface. The second top surface is adjacent to the bottom surface of the reaction plate. The bladder is coaxially located along a radially outer portion of either the top or bottom surface of the reaction plate. The bladder is connected with the polishing plate and able to expand to deform the polishing plate with respect to the bottom surface of the reaction plate.

22 Claims, 10 Drawing Sheets

(56) References Cited

U.S. PATENT DOCUMENTS

| | | | |
|---|---|---|---|
| 6,290,584 B1 * | 9/2001 | Kim et al. | 451/288 |
| 6,607,425 B1 * | 8/2003 | Kistler et al. | 451/41 |
| 7,074,118 B1 * | 7/2006 | Bottema et al. | 451/285 |
| 7,614,934 B2 * | 11/2009 | Onishi et al. | 451/6 |
| 8,834,234 B2 * | 9/2014 | Ueno et al. | 451/262 |
| 2005/0124264 A1 * | 6/2005 | Tominaga et al. | 451/41 |
| 2006/0194511 A1 * | 8/2006 | Nagayama et al. | 451/5 |
| 2008/0233840 A1 | 9/2008 | Pietsch et al. | |
| 2009/0042487 A1 * | 2/2009 | Tokura et al. | 451/41 |
| 2011/0130073 A1 * | 6/2011 | Furukawa et al. | 451/6 |
| 2012/0171933 A1 | 7/2012 | Chen | |

* cited by examiner ns of prior art.

DOUBLE SIDE POLISHER WITH PLATEN PARALLELISM CONTROL

CROSS REFERENCE

This application claims priority to U.S. Provisional Application No. 61/738,733 filed Dec. 18, 2012, the disclosure of which is hereby incorporated by reference in its entirety.

FIELD

This disclosure relates generally to polishing of semiconductor or solar wafers and more particularly to double side polishing apparatus and methods for controlling the parallelism of front and back surfaces of the semiconductor wafer.

BACKGROUND

Semiconductor wafers are commonly used in the production of integrated circuit (IC) chips on which circuitry is printed. The circuitry is first printed in miniaturized form onto surfaces of the wafers. The wafers are then broken into circuit chips. This miniaturized circuitry requires that front and back surfaces of the wafer be extremely flat and parallel to ensure that the circuitry can be properly printed over the entire surface of the wafer. To accomplish this, grinding and polishing processes are commonly used to improve flatness and parallelism of the front and back surfaces of the wafer after the wafer is cut from an ingot.

A particularly good finish is required when polishing the wafer in preparation for printing the miniaturized circuits on the wafer by an electron beam-lithographic or photolithographic process (hereinafter "lithography"). The wafer surface on which the miniaturized circuits are to be printed must be flat. Typically, flatness of the polished surfaces of the wafer are acceptable when a new polishing pad is used on the wafer, but the flatness becomes unacceptable as the polishing pad wears down over the course of polishing many wafers.

The construction and operation of conventional polishing machines contribute to the unacceptable flatness parameters. Polishing machines typically include a circular or annular polishing pad mounted on a turntable or platen for driven rotation about a vertical axis passing through the center of the pad. A polishing slurry, typically including chemical polishing agents and abrasive particles, is applied to the pad for greater polishing interaction between the polishing pad and the surface of the wafer. This type of polishing operation is typically referred to as chemical-mechanical polishing or simply CMP.

During operation, the pad is rotated and the wafer is brought into contact with the pad. As the pad wears, e.g., after a few hundred wafers, wafer flatness parameters degrade because the pad is no longer flat, but instead has a worn annular band forming a depression along the polishing surface of the pad. Such pad wear impacts wafer flatness, and may cause "dishing" or "doming".

As illustrated in FIG. 1, "doming", results in the wafer 50 having a generally convex polished surface 52. The convex surface 52 may be caused by a worn pad removing less material from the center of the front surface of the wafer 50 than from the areas closer to the wafer's edge 54. This is because the worn pad's removal rate is inverse to its wear. In other words, the portions of the worn pad with less wear remove more material than portions of the worn pad with more wear. The least amount of material is removed from the wafer 50 by the portion of the pad corresponding to the worn annular band. As a result, the polished surface 52 of the wafer is caused to have a generally "domed" shaped.

As illustrated in FIG. 2, "dishing" results in the wafer 60 having a generally concave polished surface 62. One potential reason for this occurring is that the polishing pad becomes embedded with abrasives (e.g., colloidal material from the slurry, debris from previously polished wafers, and debris from a retaining ring) causing the removal rate to increase in the areas of wear. The portions of the pad with more wear remove more material from the wafer during the polishing process than portions of the pad with less wear. As a result, more material to be removed from the center of the wafer 60 than from its edge 64 resulting in the polished surface 62 of the wafer having a generally "dished" shape.

When the flatness of the wafers becomes unacceptable (e.g., too "domed" or too "dished"), the worn polishing pad has to be replaced with a new one, or a pad dressing or conditioning operation needs to be performed to restore the pad to a useful state. These tasks add significant costs to the operation of the polishing apparatus because of the number of pads that need to be purchased, stored, and disposed of, but also because of the substantial amount of down time required to change the polishing pad or perform pad dressing/conditioning.

Accordingly, there is a need for a polishing apparatus that inhibits both doming and dishing of the surface of wafers during the polishing process and extends the useful life of the polishing pad.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

A first aspect is a platen for polishing a surface of a wafer. The platen has a reaction plate, a polishing plate, and a bladder. The reaction plate has a bottom surface and a top surface and defines a longitudinal axis extending therethrough. The polishing plate is positioned coaxially with the reaction plate. The polishing plate has a second top surface and a second bottom surface. The second top surface is adjacent to the bottom surface of the reaction plate. The bladder is disposed along a radially outer portion of one of the top surface and the bottom surface of the reaction plate. The bladder is coaxial with the reaction plate. The bladder is connected with the polishing plate for deforming the polishing plate with respect to the bottom surface of the reaction plate.

Another aspect is a polishing apparatus for double side polishing of silicon wafers. The polishing apparatus includes a first and second platen, and a wafer carrier. The first platen has a reaction plate, a polishing plate, and a bladder. The reaction plate has a bottom surface and a top surface and defines a longitudinal axis extending therethrough. The polishing plate is positioned coaxially with the reaction plate, and has a second top and bottom surface. The second top surface is adjacent to the bottom surface of the reaction plate. The bladder is disposed along a radially outer portion of the top or bottom surface of the reaction plate. The bladder is coaxially located with the reaction plate, and connected with the polishing plate for deforming the polishing plate with respect to the bottom surface of the reaction plate. The second platen is disposed coaxially with the first platen. The second platen is spaced from the first platen to form a gap therebetween. The wafer carrier is disposed within the gap between the first platen and the second platen.

Another aspect is a method for polishing silicon wafers. A polishing apparatus includes a wafer carrier and a platen that has a reaction plate, a polishing plate, and a bladder. The reaction plate has a bottom surface and a top surface and defines a longitudinal axis extending therethrough. The polishing plate is positioned coaxially with the reaction plate, and has a second top and bottom surface. The second top surface is adjacent to the bottom surface of the reaction plate. The bladder is disposed along a radially outer portion of the outer surface or the bottom surface of the reaction plate. The bladder is coaxially located with the reaction plate. The bladder is connected with the polishing plate for deforming the polishing plate with respect to the bottom surface of the reaction plate. The wafer carrier is located adjacent to the second bottom surface of the polishing plate. A wafer is placed in the wafer carrier. At least a surface of the wafer is polished by causing movement between the wafer and the polishing plate to form a polished surface on the wafer. A flatness of the polished surface of the wafer is determined. An internal pressure within the bladder is adjusted to deflect the polishing plate with respect to the wafer carrier for improving flatness of the polished surface.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
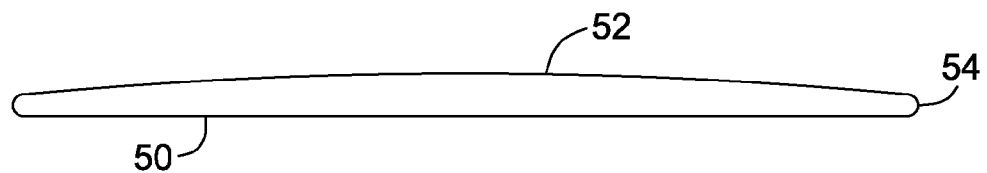
FIG. 1 is a side elevation of a domed-shaped wafer.
Figure 2:
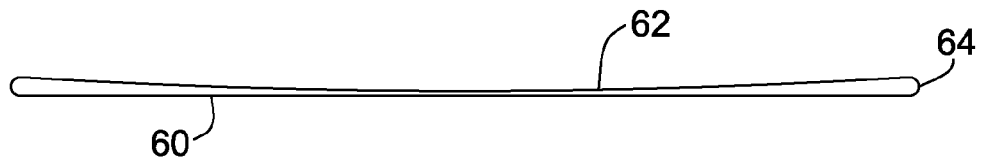
FIG. 2 is a side elevation of a dish-shaped wafer.
Figure 3:
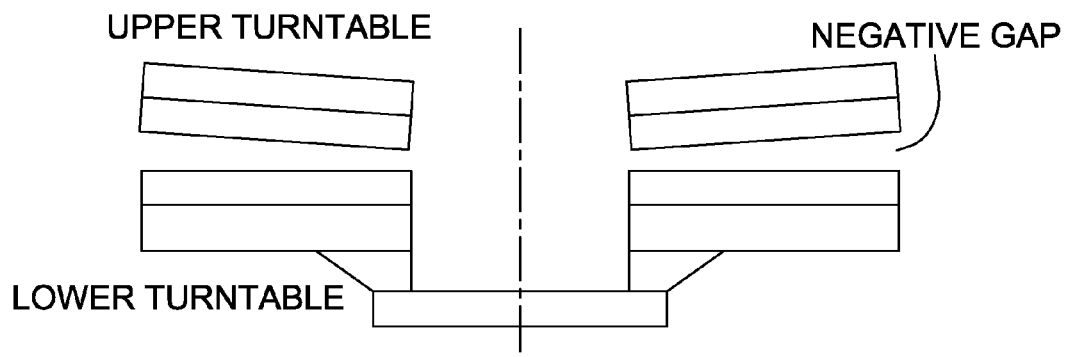
FIG. 3 is a side elevation of a double side polisher with a double side polisher having a negative gap.
Figure 4:
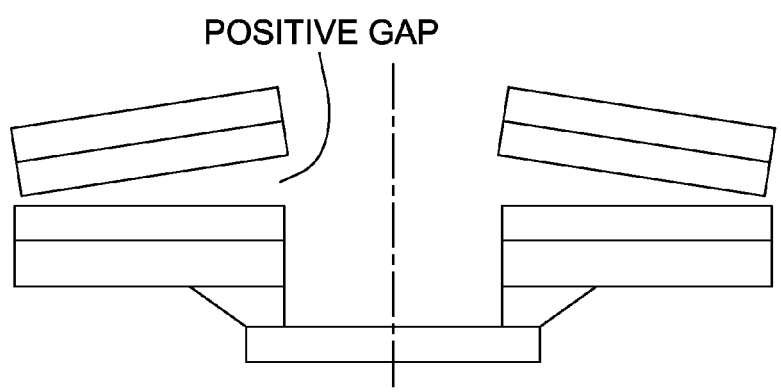
FIG. 4 is a side elevation of a double side polisher with the upper turntable having a positive gap.
Figure 5:
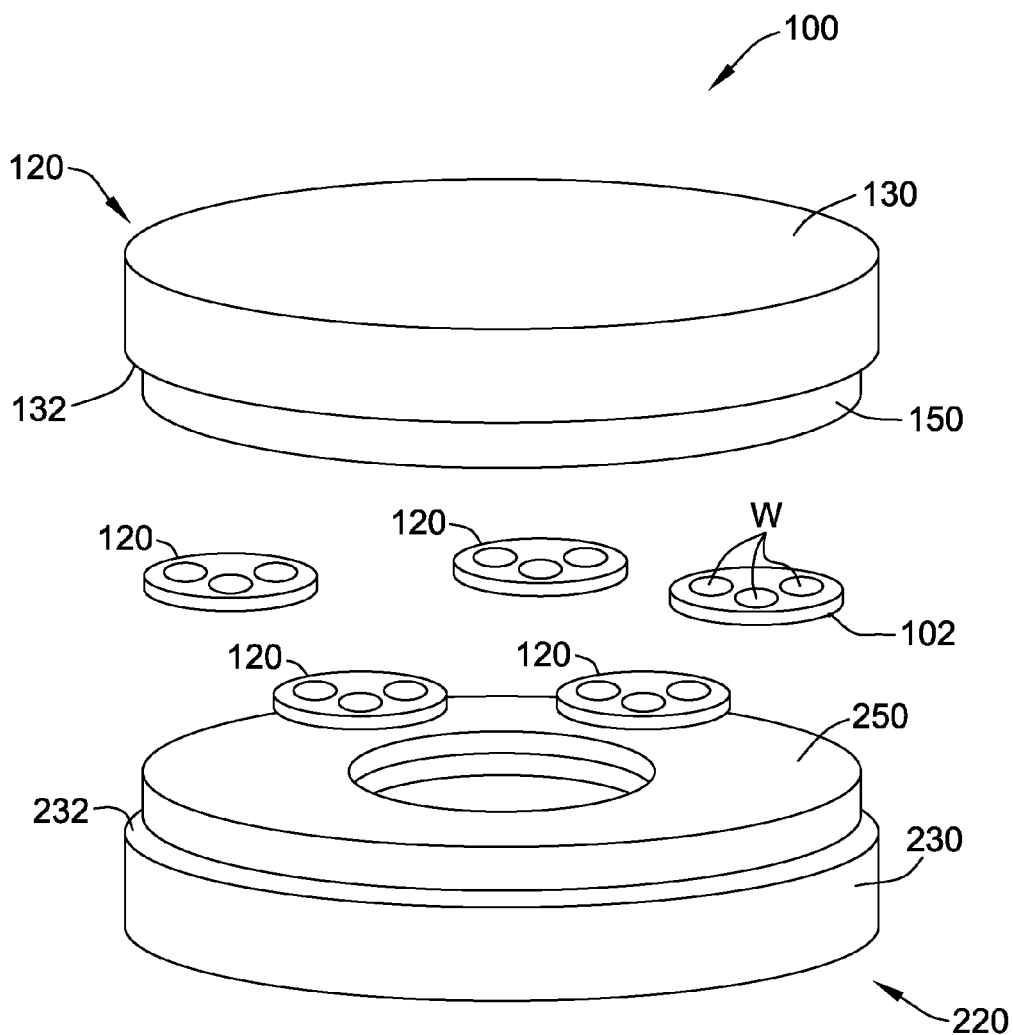
FIG. 5 is an exploded view of a wafer double side polisher apparatus in accordance with one embodiment.

Referring to FIG. 5, a portion of a double side polishing apparatus is shown schematically and indicated generally at 100. The double side polisher is used to polish front and back sides of semiconductor wafers W sliced from one or more monocrystalline silicon ingots. It is contemplated that other types of double side polishing apparatus' may be used. The polishing apparatus 100 includes a plurality of generally annular wafer carriers 102 positioned between a generally annular first platen 120 and a generally annular second platen 220.

Each wafer carrier 102 has at least one circular opening (three in this embodiment) to receive a wafer W to be polished therein. The periphery of each wafer carrier 102 has a ring gear (not shown) engaged by a "sun" or inner gear and an outer gear (not shown) of the polishing apparatus 100. The inner and outer gears are driven by suitable drive mechanisms to rotate the carrier at a selected speed.

The first platen 120 and second platen 220 are rotated at a selected rotation speed by a suitable drive mechanism (not shown) as is known in the art. In some embodiments, the apparatus 100 includes a controller (not shown) that allows the operator to select a rotation speed for the first platen 120 that is different than the selected speed for the second platen 220. In some embodiments, the first platen 120 and second platen 220 are rotatable in the same direction or in opposite directions.

With additional reference to FIG. 5, the first platen 120 includes a reaction plate 130 and a polishing plate 150. The polishing plate 150 is mounted in spaced relation to a bottom surface 132 of the reaction plate 130. The second platen 220 includes a second reaction plate 230 and a second polishing plate 250. The second polishing plate 250 is mounted in spaced relation to a surface 232 of the second reaction plate 250.

Figure 7:
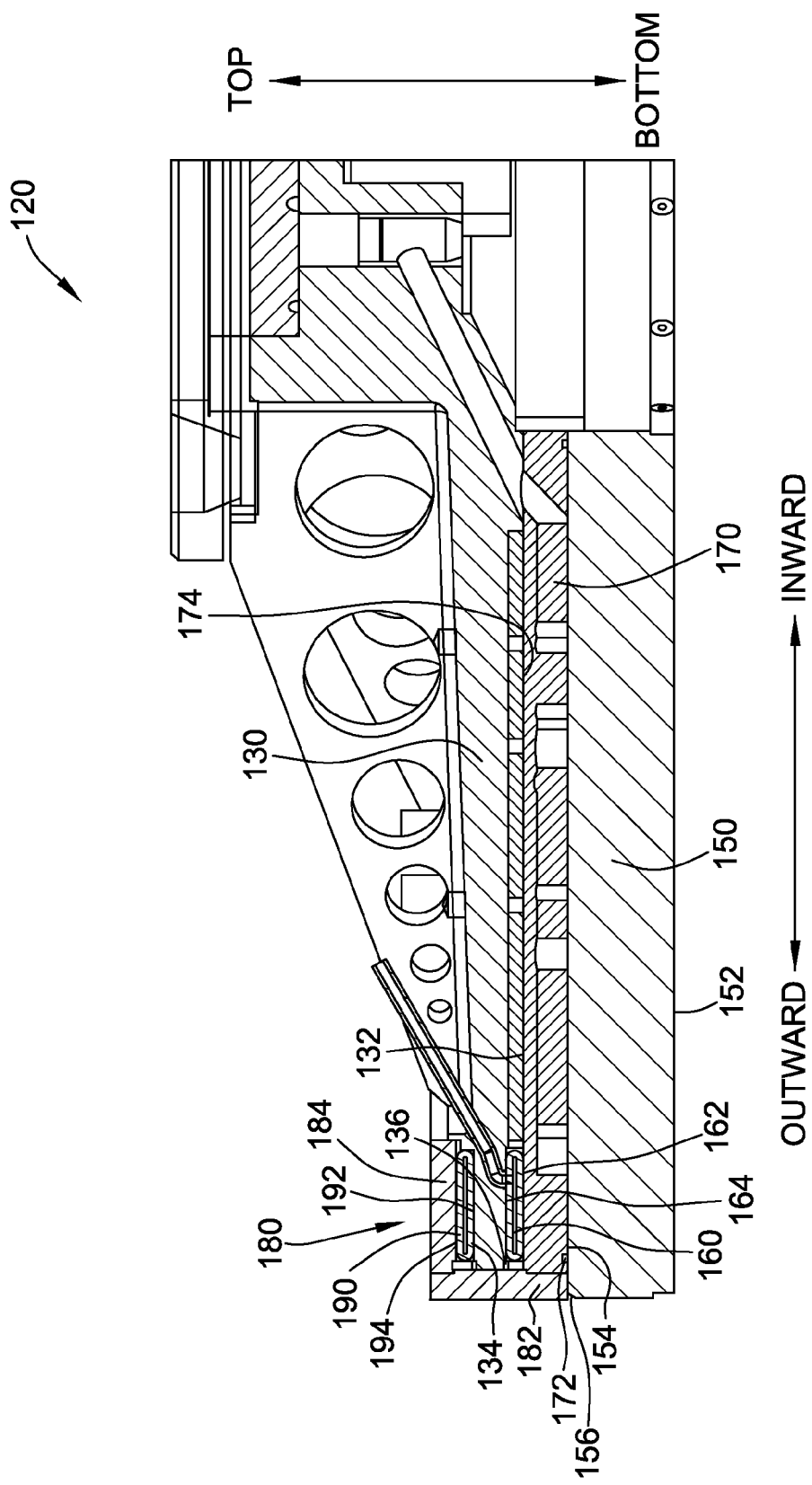
FIG. 7 is a partial cross section of the first platen of the double side polisher apparatus of FIG. 5.

With additional reference to FIG. 7, the first platen 120 includes a generally annular bladder 160 and a heat exchange manifold 170. The bladder 160 and heat exchange manifold 170 are spaced between and are in coaxial alignment with the reaction plate 130 and the polishing plate 150. The bladder 160 is able to expand and contract based on internal pressure that may be adjusted by a pressure control system (not shown). The pressure control system may include, for example, hydraulic or pneumatic actuation, although other actuation systems are contemplated. These actuation systems are well known in the relevant art and will not be described in detail here.

The bottom surface 132 of reaction plate 130 is in immediate contact with a top surface 164 of the bladder 160 along an outer edge 136 of the reaction plate. The reaction plate 130 is sufficiently rigid to resist deflection as a result of applied expansion forces from the bladder 160. The heat exchange manifold 170 has a top surface 174 that is adjacent to both the bottom surface 132 of the reaction plate 130 and a bottom surface 162 of the bladder 160. The bottom surface 132 of the reaction plate 130 and the top surface 174 of the heat exchange manifold 170 are in spaced relation to form a gap therebetween.

The heat exchange manifold 170 has a bottom surface 172 immediately adjacent to a top surface 154 of the polishing plate 150. As a result, any expansion by the bladder 160 reacts against the reaction plate 130 to force the heat exchange manifold 170 and the polishing plate 150 to deflect in a downward direction toward the wafer carriers 102.

The double side polishing apparatus 100 includes a first temperature control system (not shown) for controlling circulation of a heat exchange media through the heat exchange manifold 170 of the first platen 120 for adjusting the temperature of the polishing plate 150.

In some embodiments, the bottom surface 152 of the polishing plate 150 has a planar shape in a natural state. In these embodiments, initial expansion by the bladder 160 deflects or deforms the second bottom surface 152.

In some embodiments, the bottom surface 152 of the polishing plate 150 has a conical shape in a natural or undeflected state. In these embodiments, initial expansion by the bladder 160 deflects the bottom surface 152 of the polishing plate 150 from the conical shape to a substantially planar shape. Additional expansion by the bladder 160 forces the bottom surface 152 of the polishing plate 150 to further deflect into an opposite conical shape from the initial undeflected state.

The first platen 120 includes a generally annular cantilever ring 180. The cantilever ring 180 has a leg 182 and an arm 184 that are substantially perpendicular to each other. The leg 182 and the arm 184 form an L-shape cross-section. The leg 182 is connected with an outer edge 156 of the polishing plate 150, and extends longitudinally along the reaction plate. The arm 184 extends radially inward from the leg to a location over a top surface 134 of the reaction plate 130, to extend over at least a portion of the reaction plate. The overlapping arm 184 and reaction plate 130 may act to limit movement of the polishing plate 150 with respect to the reaction plate, limiting deformation of the polishing plate with respect to the bottom surface of the reaction plate. In the normal range of operation, the overlapping arm 184 and the reaction plate 130 have sufficient clearance to prevent contact that limits movement with respect to each other.

The first platen 120 also includes a second generally annular bladder 190 located between the arm 184 of the cantilever ring 180 and the reaction plate 130, along an outer circumferential edge 136 of the reaction plate 130. The first annular bladder 160 and second annular bladder 190 are in substantially opposing positions along bottom and top surfaces 132, 134 of the reaction plate 130. An expansion force within the second bladder 190 causes a bottom surface 192 of the second bladder to react against the reaction plate 130, which is sufficiently rigid to resist deflection as a result of applied expansion forces from within the second bladder 190.

The expansion force then drives the cantilever ring 180 upward and away from the reaction plate 130. The upward movement of the cantilever ring 180 in turn forces an upward movement of the outer edge 156 of the polishing plate 150 toward the reaction plate 130. As a result, the polishing plate 150 is deflected along a radial length thereof.

Figure 6:
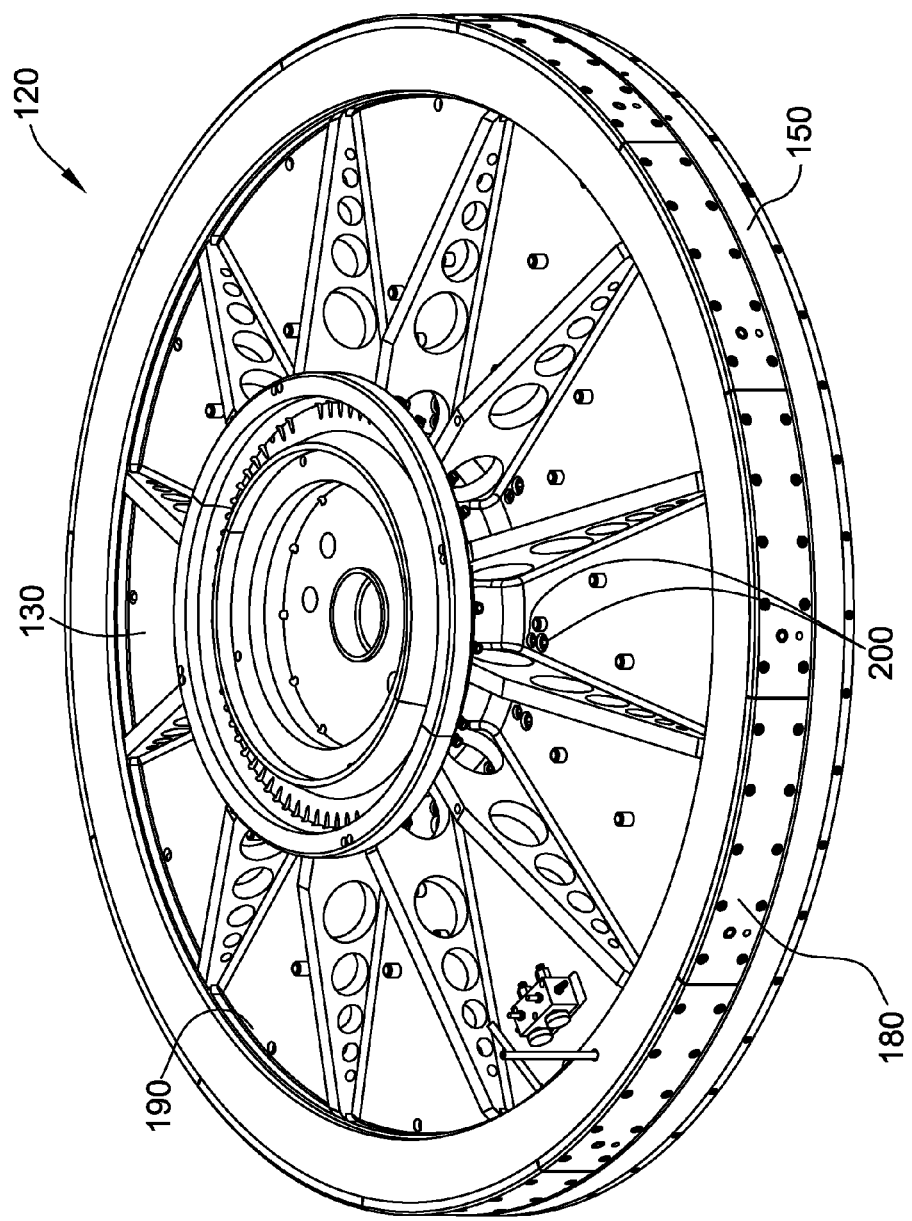
FIG. 6 is a perspective view of a first platen of the double side polisher apparatus of FIG. 5.

The first platen 120 includes an annular ring of fasteners 200, as shown in FIG. 6, located radially inward from the bladder 160. With additional reference to FIG. 7, the fasteners 200 connect the reaction plate 130, the heat exchange manifold 170, and the polishing plate 150. The placement of the fasteners 200 provide a binding point that allows the outer edge 156 of the polishing plate 150 to move longitudinally with respect to the bottom surface 132 of the reaction plate 130. When an expansion force is changed within either of the bladders 160, 190 the polishing plate 150 is forced to bend about the fasteners 200. Thus, the polishing plate 150 is deflected about the fasteners 200.

The pressure control system in combination with the bladders 160, 190 allow the gap between the edge 156 of the polishing plate 150 and the second polishing plate 250 to be controlled. Adding expansion force, in the form of internal pressure, to the bladders 160, 190 causes the bladders to expand or grow in size, and removing the pressure causes the bladders to contract or shrink in size.

Thousands of pounds of force can be generated with relatively low pressure (<100 psi) due to the large area of the bladders 160, 190. The operating pressure within the bladders 160, 190, is typically less than 45 psi, and more specifically, typically ranges from about 20 psi to about 30 psi. This range of pressure provides a range of deformation of the outer edge 156 of the polishing plate 150 from approximately −200 um to approximately +150 um. In some embodiments, the range of deformation is from approximately −150 um to approximately +150 um, or from approximately −150 um to approximately +100 um.

The pressure within each bladder 160, 190 is distributed evenly along the upper and lower surfaces of the respective bladder. Thus, the bladders 160, 190 are allowed to uniformly expand and contract, in a longitudinal direction, around the circumference of the reaction plate 130. As a result, the expansion force within the bladders 160, 190 are inherently uniform.

It is contemplated that the second platen 220 could also include the above described structure of the second platen 220 to provide deflection of the second polishing plate 250 with respect to the second reaction plate 230. It is also contemplated that the double side polishing apparatus includes a second temperature control system (not shown) for controlling circulation of a cooling media through a heat exchange manifold of the first platen 120. The separate systems enable the user to vary temperatures of the second polishing plate 250 and the polishing plate 150 independently of each other.

Figure 8:
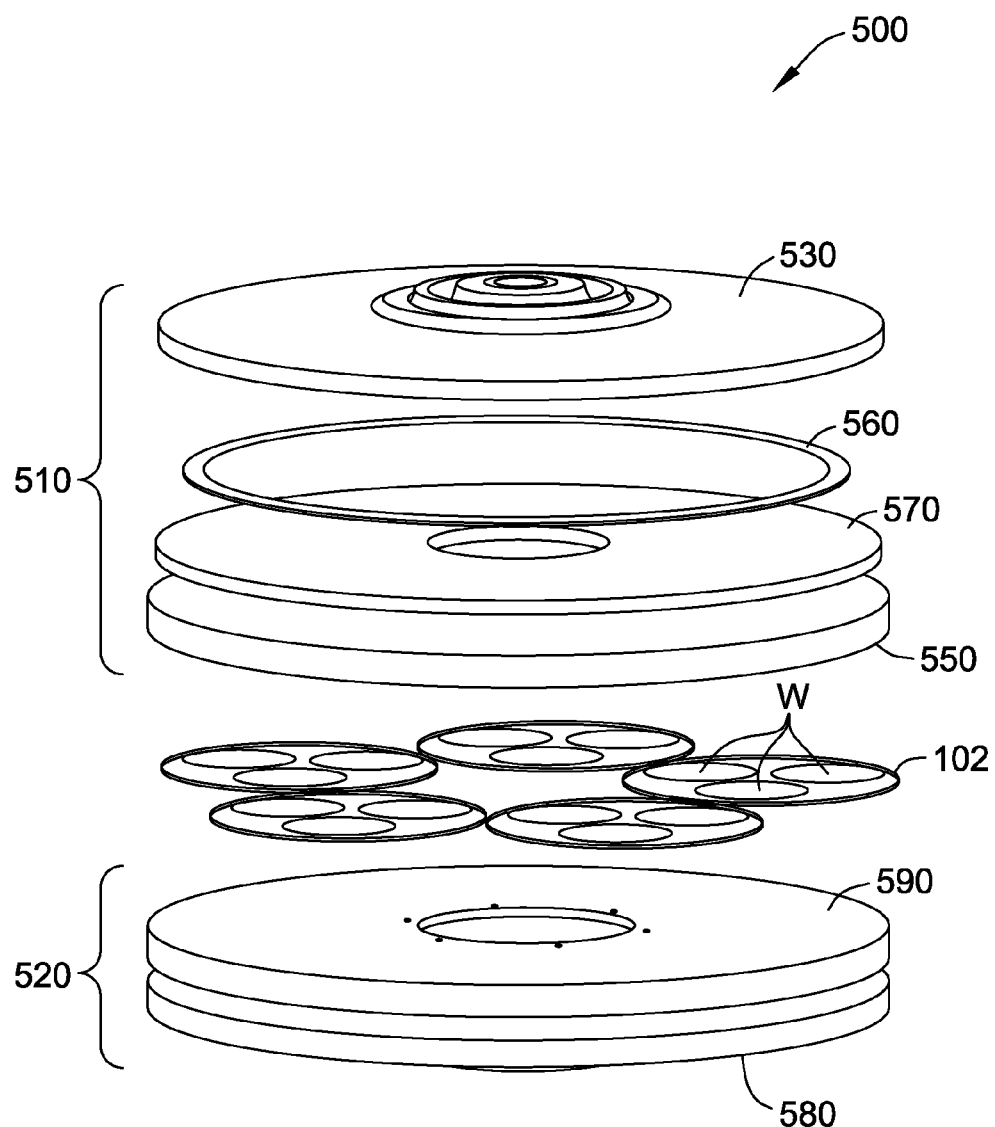
FIG. 8 is an exploded view of a wafer double side polisher apparatus of another embodiment.
Figure 9:
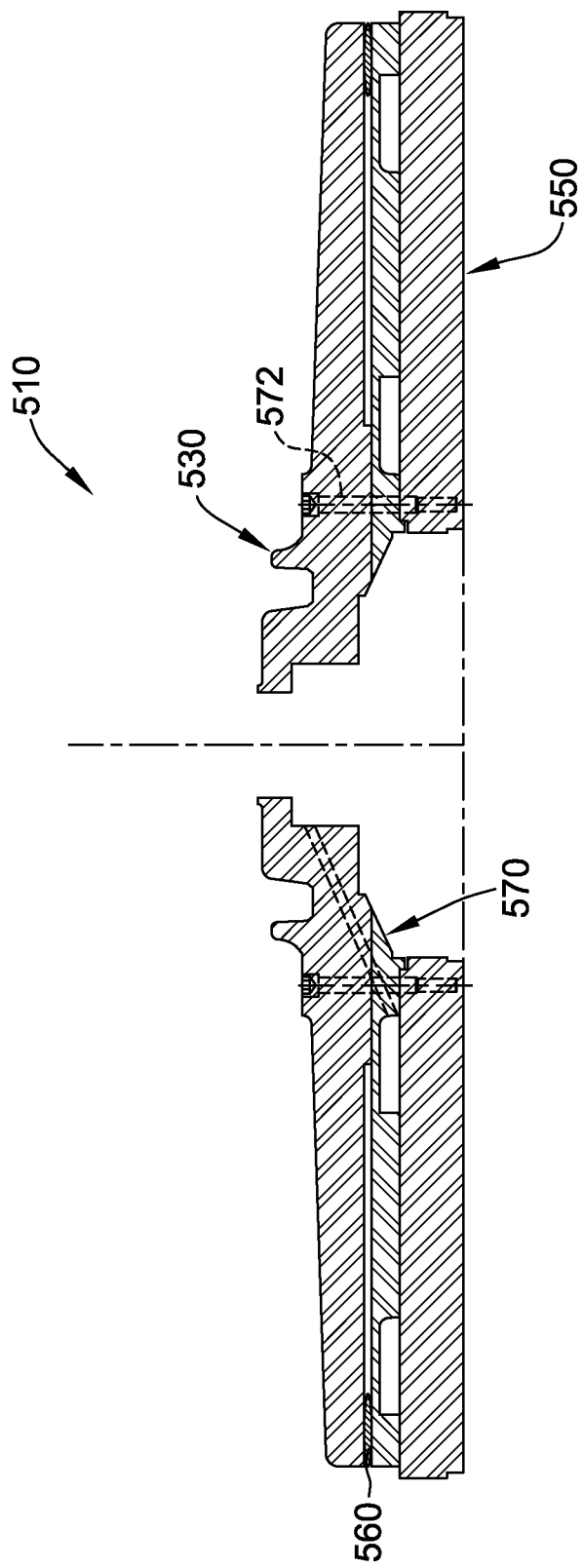
FIG. 9 is a cross sectional view of a first platen of the double side polisher apparatus of FIG. 8.
Figure 10:
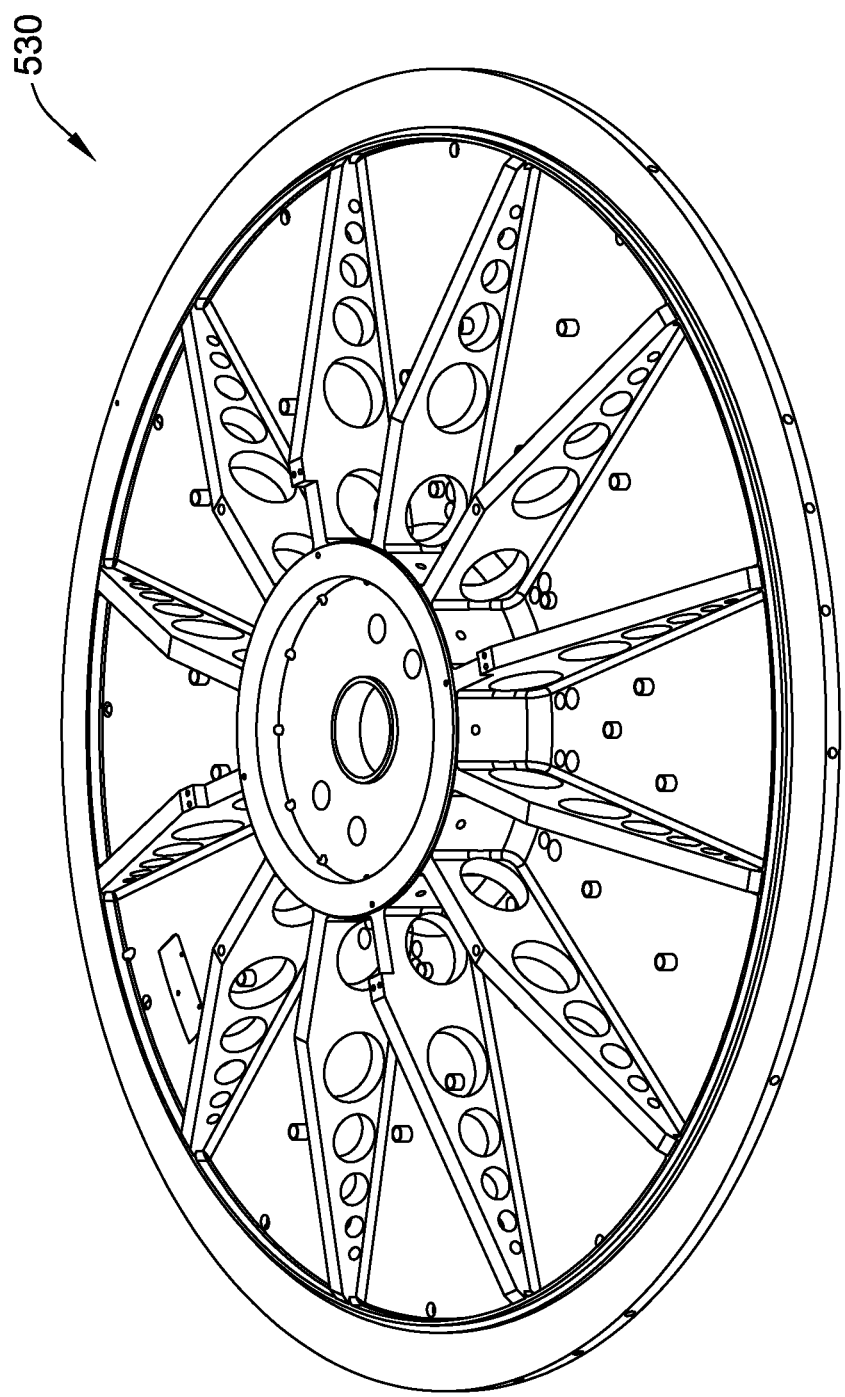
FIG. 10 is perspective view of a reaction plate of FIGS. 8 and 9.
Figure 12:
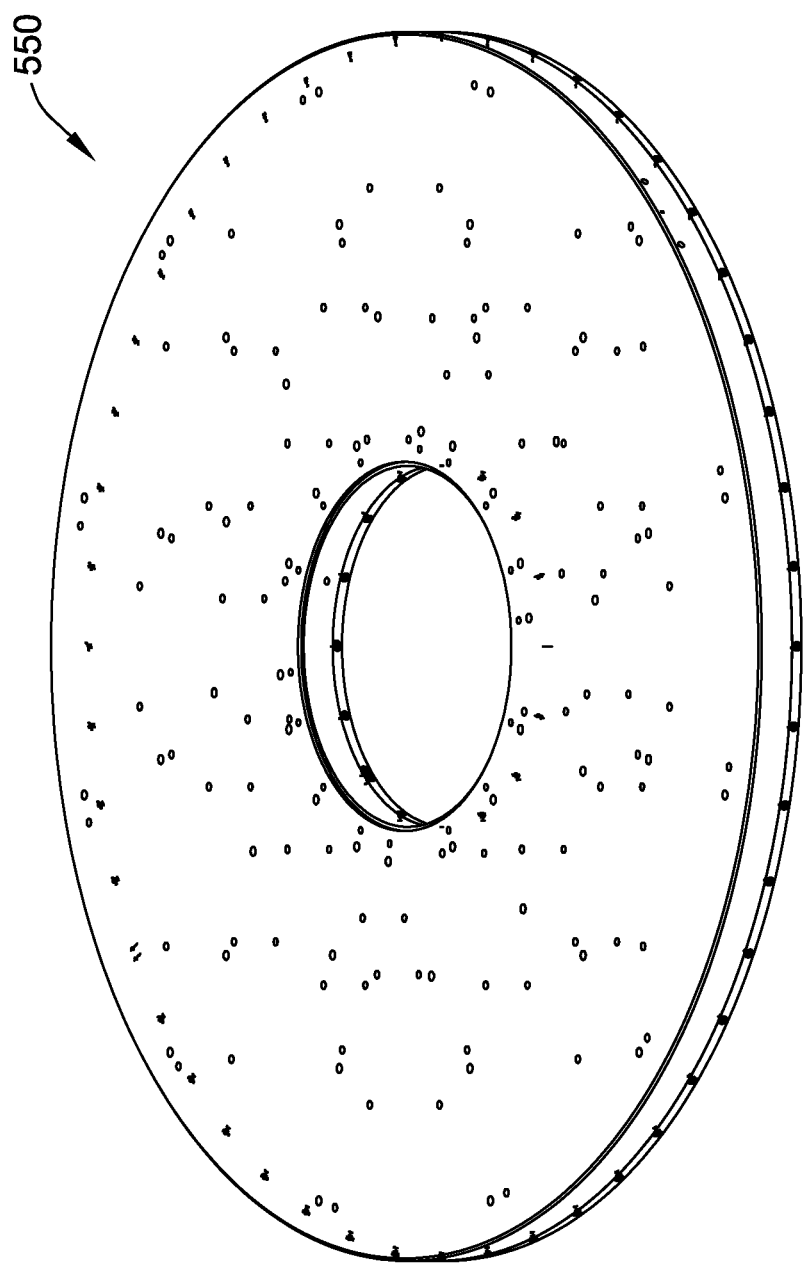
FIG. 12 is perspective view of a polishing plate of FIGS. 8 and 9.

A double side polishing apparatus of another embodiment is shown in FIG. 8 and generally referred to as 500. The polishing apparatus 500 includes a first platen 510, as shown in FIG. 9, and a second platen 520 on each side of a wafer carrier 102. The first platen 510 includes a reaction plate 530, as shown in FIG. 10, and a polishing plate 550, as shown in FIG. 12, and the second platen 520 includes a second reaction plate 580 and a second polishing plate 590.

Figure 11:
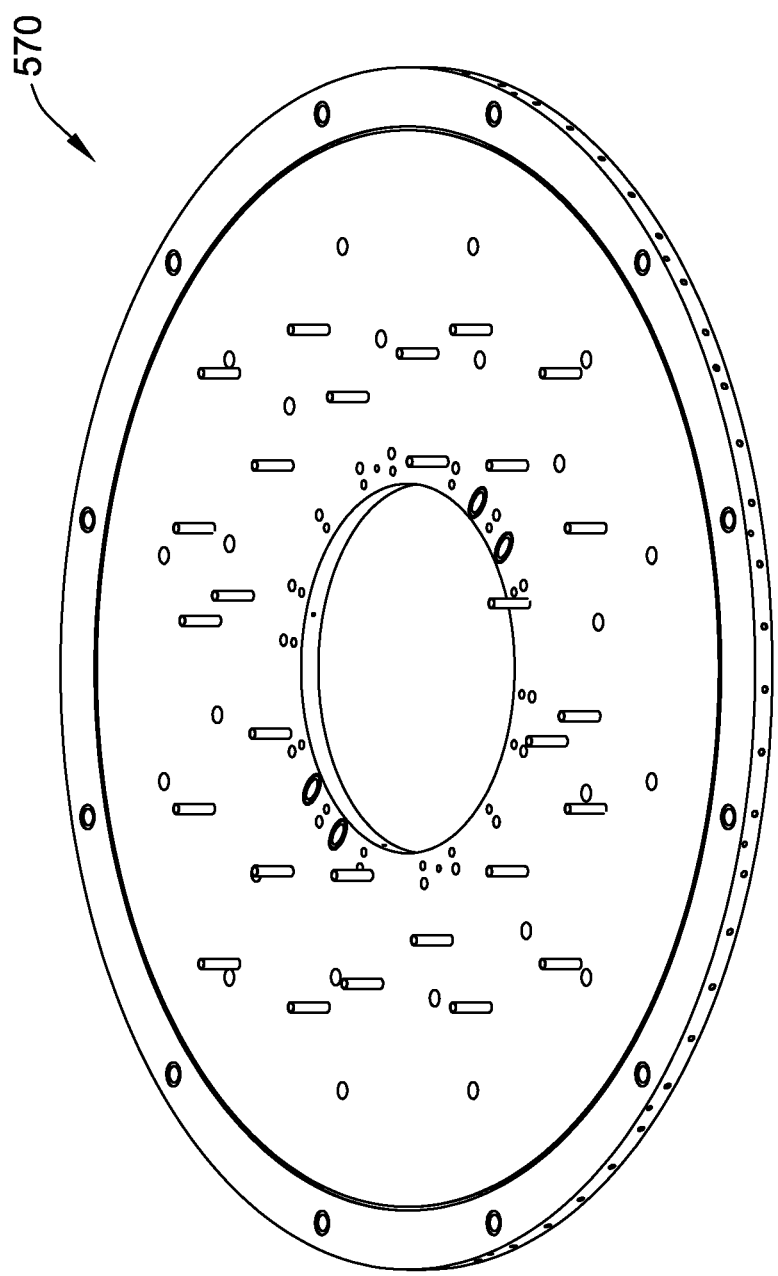
FIG. 11 is perspective view of a heat exchange manifold of FIGS. 8 and 9.

The reaction plate 530 is located above the polishing plate 550. An annular bladder 560 and a heat exchange manifold 570, as shown in FIG. 11, are located between the reaction plate 530 and the polishing plate 550.

A ring of fasteners 572 connect the polishing plate 550 and the heat exchange manifold 570 with the reaction plate 530. The ring of fasteners 572 are radially spaced from a center of the first platen 510 at a substantially common distance. The fasteners 572 provide a bending point about which the polishing plate may be deflected.

In a method of one embodiment, a polishing apparatus has a wafer carrier mounted between a polishing plate of a first platen and a second polishing plate of a second platen. At least one wafer is positioned within the wafer carrier. One side of the wafer faces the polishing plate and the other side of the wafer faces the second polishing plate.

In operation, the first platen is lowered downward toward the second platen to bring the polishing plate into contact with one side of the wafer and to bring the second polishing plate into contact with the other side of the wafer. A polishing slurry is applied to at least one of the polishing plates. The wafer carrier, the polishing plate, and the second polishing plate are rotated. The first platen is forced downward during polishing at a selected "down force" so that the sides of the wafer are polished simultaneously by the respective polishing plates. Movement of the polishing plates in relation to the wafer polishes a portion of the wafer to form a polished surface.

This double side polishing operation is performed for a relatively short period, e.g., about less than one hour. Note that the amount of material removed in the double side polishing is an order of magnitude greater than that removed during finish polishing.

The wafer is removed from the wafer carrier and the flatness of the polished surface is determined by a suitable method. If it is determined that the flatness of the polished surface is not within a preset standard deviation, internal pressure within an bladder is adjusted to deflect the polishing plate with respect to the wafer carrier for improving flatness of the polishing surface. The adjusting pressure within the bladder may be increased or decreased to deform the polishing plate along a radial length. As a result, an edge of the polishing plate is moved to or from the wafer.

Additional processing steps may be performed to the wafer that affects the flatness of the polished surface before the flatness is determined. The additional processing steps may include providing a finish polish to the polished surface of the wafer and/or depositing a layer of silicon along the polished surface of the wafer.

The embodiments described herein enable an efficient and economical polishing apparatus and method of processing semiconductor wafers including simultaneously polishing surfaces of the semiconductor wafer. The apparatus and method extend the operational run time of the polishing apparatus. Other benefits include improved wafer yield and product tolerances, while reducing the time needed for maintenance associated with replacement of the polishing pads.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A platen for polishing a surface of a wafer, the platen comprising:
   a reaction plate having a top surface and a bottom surface and defining a longitudinal axis extending therethrough;
   a polishing plate positioned coaxially with the reaction plate, the polishing plate having a second top surface and a second bottom surface, the second top surface being adjacent to the bottom surface of the reaction plate;
   a bladder disposed along a radially outer portion of one of the top surface and the bottom surface of the reaction plate, the bladder being coaxial with the reaction plate, the bladder being connected with the polishing plate for deforming the polishing plate with respect to the bottom surface of the reaction plate; and
   an annular ring of fasteners connecting the reaction plate with the polishing plate, the annular ring of fasteners being spaced radially inward from the bladder to allow an outer edge of the polishing plate to move longitudinally with respect to the bottom surface of the reaction plate.

2. The platen of claim 1, wherein the bladder is located between the reaction plate and the polishing plate to allow expansion of the bladder to deform the polishing plate away from the bottom surface of the reaction plate.

3. The platen of claim 2, wherein the second bottom surface of the polishing plate has a conical shape in a first position, the bladder being positioned to deform the second bottom surface from the conical shape to a substantially planar shape.

4. The platen of claim 1, further comprising a heat exchange manifold extending at least partially between the reaction plate and the polishing plate for regulating temperature of the polishing plate.

5. The platen of claim 1, further comprising a cantilever ring connected with the polishing plate, the cantilever ring having a leg extending longitudinally along the reaction plate and an arm extending radially from the leg along at least a portion of the top surface of the reaction plate to limit deformation of the polishing plate with respect to the bottom surface of the reaction plate.

6. The platen of claim 5, wherein the bladder is positioned between the arm of the cantilever ring and the top surface of the reaction plate to allow expansion of the bladder to deform the polishing plate toward the bottom surface of the reaction plate.

7. A polishing apparatus for double side polishing of silicon wafers, the polishing apparatus comprising:
   a first platen including:
      a reaction plate having a top surface and a bottom surface and defining a longitudinal axis extending therethrough;
      a polishing plate positioned coaxially with the reaction plate, the polishing plate having a second top surface and a second bottom surface, the second top surface being adjacent to the bottom surface of the reaction plate;
      a bladder disposed along a radially outer portion of one of the top surface and the bottom surface of the reaction plate, the bladder being coaxially located with the reaction plate, the bladder being connected with the polishing plate for deforming the polishing plate with respect to the bottom surface of the reaction plate; and
      an annular ring of fasteners connecting the reaction plate with the polishing plate, the annular ring of fasteners being spaced radially inward from the bladder to allow an outer edge of the polishing plate to move longitudinally with respect to the bottom surface of the reaction plate;
   a second platen disposed coaxially with the first platen, the second platen being spaced from the first platen to form a gap therebetween; and
   a wafer carrier disposed within the gap between the first platen and the second platen.

8. The polishing apparatus of claim 7, wherein the bladder is located between the reaction plate and the polishing plate to allow expansion of the bladder to deform the polishing plate away from the bottom surface of the reaction plate.

9. The polishing apparatus of claim 7, wherein the second bottom surface of the polishing plate has a planar shape in a natural state, the bladder being positioned to deform the second bottom surface from the planar shape.

10. The polishing apparatus of claim 7, wherein the first platen includes a cantilever ring connected with the polishing plate, the cantilever ring having a leg extending longitudinally along the reaction plate and an arm extending radially from the leg along at least a portion of the top surface of the reaction plate to limit deformation of the polishing plate with respect to the bottom surface of the reaction plate.

11. The polishing apparatus of claim 10, wherein the bladder is positioned between the arm of the cantilever ring and the top surface of the reaction plate to allow expansion of the bladder to deform the polishing plate toward the bottom surface of the reaction plate.

12. The polishing apparatus of claim 11, wherein the first platen includes a second bladder disposed between the reaction plate and the polishing plate to allow expansion of the bladder to deform the polishing plate away from the bottom surface of the reaction plate.

13. The polishing apparatus of claim 7, wherein the first platen includes a heat exchange manifold extending at least partially between the reaction plate and the polishing plate for regulating temperature of the polishing plate.

14. The polishing apparatus of claim 13, wherein the heat exchange manifold is in contact with the polishing plate, the first platen including a second bladder disposed between the bottom surface of the reaction plate and the heat exchange manifold to allow expansion of the bladder to deform the polishing plate away from the bottom surface of the reaction plate.

15. A method for polishing of silicon wafers, the method comprising:
   providing a polishing apparatus including:
      a platen including:
         a reaction plate having a top surface and a bottom surface and defining a longitudinal axis extending therethrough;
         a polishing plate positioned coaxially with the reaction plate, the polishing plate having a second top surface and a second bottom surface, the second top surface being adjacent to the bottom surface of the reaction plate;
         a bladder disposed along a radially outer portion of one of the top surface and the bottom surface of the reaction plate, the bladder being coaxially located with the reaction plate, the bladder being connected with the polishing plate for deforming the polishing plate with respect to the bottom surface of the reaction plate; and
         an annular ring of fasteners connecting the reaction plate with the polishing plate, the annular ring of fasteners being spaced radially inward from the bladder to allow an outer edge of the polishing plate to move longitudinally with respect to the bottom surface of the reaction plate; and
      a wafer carrier located adjacent to the second bottom surface of the polishing plate;
   placing a wafer in the wafer carrier;
   polishing at least a surface of the wafer by causing movement between the wafer and the polishing plate to form a polished surface on the wafer;
   determining a flatness of the polished surface of the wafer; and
   adjusting an internal pressure within the bladder to deflect the polishing plate with respect to the wafer carrier for improving flatness of the polished surface.

16. The method of claim 15, further comprising applying a slurry to the wafer.

17. The method of claim 15, further comprising finish polishing the polished surface of the wafer prior to the step of determining flatness of the polished surface of the wafer.

18. The method of claim 15, further compromising depositing a layer of silicon on the polished surface of the wafer prior to the step of determining flatness of the polished surface of the wafer.

19. A platen for polishing a surface of a wafer, the platen comprising:
   a reaction plate having a top surface and a bottom surface and defining a longitudinal axis extending therethrough;
   a polishing plate positioned coaxially with the reaction plate, the polishing plate having a second top surface and a second bottom surface, the second top surface being adjacent to the bottom surface of the reaction plate;
   a bladder disposed along a radially outer portion of one of the top surface and the bottom surface of the reaction plate, the bladder being coaxial with the reaction plate, the bladder being connected with the polishing plate for deforming the polishing plate with respect to the bottom surface of the reaction plate; and
   a heat exchange manifold extending at least partially between the reaction plate and the polishing plate for regulating temperature of the polishing plate.

20. A platen for polishing a surface of a wafer, the platen comprising:
   a reaction plate having a top surface and a bottom surface and defining a longitudinal axis extending therethrough;
   a polishing plate positioned coaxially with the reaction plate, the polishing plate having a second top surface and a second bottom surface, the second top surface being adjacent to the bottom surface of the reaction plate;
   a bladder disposed along a radially outer portion of one of the top surface and the bottom surface of the reaction plate, the bladder being coaxial with the reaction plate, the bladder being connected with the polishing plate for deforming the polishing plate with respect to the bottom surface of the reaction plate; and
   a cantilever ring connected with the polishing plate, the cantilever ring having a leg extending longitudinally along the reaction plate and an arm extending radially from the leg along at least a portion of the top surface of the reaction plate to limit deformation of the polishing plate with respect to the bottom surface of the reaction plate.

21. The platen of claim 20, wherein the bladder is positioned between the arm of the cantilever ring and the top surface of the reaction plate to allow expansion of the bladder to deform the polishing plate toward the bottom surface of the reaction plate.

22. The platen of claim 21, wherein the platen includes a second bladder disposed between the reaction plate and the polishing plate to allow expansion of the bladder to deform the polishing plate away from the bottom surface of the reaction plate.

* * * * *